United States Patent [19]

Kurita

[11] 4,251,619
[45] Feb. 17, 1981

[54] PROCESS FOR FORMING PHOTO-POLYMERIC IMAGE

[75] Inventor: Yoshio Kurita, Hino, Japan

[73] Assignee: Konishiroku Photo Industry Co., Ltd., Hino, Japan

[21] Appl. No.: 105,540

[22] Filed: Dec. 20, 1979

Related U.S. Application Data

[63] Continuation of Ser. No. 913,213, Jun. 6, 1978, abandoned.

[30] Foreign Application Priority Data

Jun. 8, 1977 [JP] Japan .................................. 52-68075

[51] Int. Cl.³ .......................... G03C 5/04; G03C 1/68
[52] U.S. Cl. ................................ 430/292; 204/159.18; 204/159.23; 204/159.24; 430/269; 430/281; 430/193
[58] Field of Search ................. 96/27 R, 35.1, 119 R, 96/115 P; 204/159.18, 159.23, 159.24; 430/292, 293, 281, 270, 269

[56] References Cited

U.S. PATENT DOCUMENTS

| | | | |
|---|---|---|---|
| 3,201,255 | 8/1965 | Mueller et al. | 96/115 P |
| 3,607,691 | 9/1971 | Goldberg et al. | 204/159.23 |
| 3,615,452 | 10/1971 | Cerwanka | 204/159.24 |
| 3,627,656 | 12/1971 | Miller et al. | 204/159.24 |
| 3,637,375 | 1/1972 | Levinas | 204/159.24 |
| 3,773,515 | 11/1973 | Yamashita et al. | 96/90 R |
| 3,775,130 | 11/1973 | Enomoto et al. | 204/159.23 |
| 3,820,993 | 6/1974 | Lewis et al. | 204/159.23 |
| 3,951,658 | 4/1976 | Marsh et al. | 497/150 |
| 4,006,013 | 2/1977 | McLaughlin et al. | 430/292 |
| 4,163,672 | 8/1979 | Stahlhofen | 430/292 |

OTHER PUBLICATIONS

Margerum et al., Photographic Science and Engineering, vol. 12, No. 4, Aug. 1968.

*Primary Examiner*—Jack P. Brammer

[57] ABSTRACT

This invention relates to a process for forming photopolymerized images in light sensitive layers containing an activated component, a light sensitive resin and a colorable or decolorable component. Upon exposure to activating radiation the colored component is decolored or the decolorable component is colored and the energy involved is transferred to the light sensitive resin for polymerization.

11 Claims, No Drawings

PROCESS FOR FORMING PHOTO-POLYMERIC IMAGE

This is a Rule 60 continuation of U.S. patent application Ser. No. 913,213, filed June 6, 1978, and now abandoned.

This invention relates to a process for forming a photo-polymerized image which process is novel and is possible to increase sensitivity.

It has been described, for example, in Photo. Sci. Eng., 12, 177 (1968) that an attempt has been made to increase sensitivity in obtaining a photo-polymerized image. This attempt is intended to achieve a high quantum yield by virtue of a chain reaction of photo-polymerization. However, in order to prosecute the chain reaction smoothly, insurance of free distribution of a material is set up as a premise and therefore the art as defined above in applicable only in a solution. Consequently, the use thereof will be limited.

An object of this invention resides in the provision of a process for forming a novel photo-polymerized image. A further object of this invention is to provide a process for forming a photo-polymerized image of high sensitivity. A more further object of this invention is to provide a process for forming a highly photo-polymerized image. A more further object of this invention is to provide a polymerized image excellent in physical, chemical and photographic characteristics.

As a result of extensive researches with regard to the above objects, the inventors have found the present invention, that is a process for forming a photo-polymerized image by using an activating component, a colorable or decolorable component and a light-sensitive resin, which process comprises (i) a first step in which an active ray having an energy which can activate the activating component is imagewise or uniformly irradiated on a light-sensitive layer containing the activating component, the colorable or decolorable component and the light-sensitive resin, whereby the activated activating component is reacted with the colorable or decolorable component for the coloration or decoloration thereof and (ii) a subsequent second step to imagewise or uniformly expose the light-sensitive layer to a light which by itself does not activate said activating component nor cause the polymerization of the light-sensitive resin, but is included within the range of wavelength that is absorbed by the color of the above coloration or decoloration, characterized in that an irradiation in one of the above steps (i) and (ii) is carried out imagewise and the other irradiation is effected uniformly on the whole surface to form the photo-polymerized image corresponding to the above imagewise irradiation.

This invention will be explained in detail hereinafter.

In the present invention, the term "activating component" means a component which can generate a free-radical as a result of active irradiation (a free-radical generating agent) or a component which forms an oxidative compound by the active irradiation (an active radiation oxidizing agent). The activating component is reacted with the colorable or decolorable component existing together in the light-sensitive layer as a function of the active irradiation, causing thereby coloration or decoloration in the portion where said active radiation was applied.

According to this invention, as the activating component are useful a free-radical generating agent, such as an organic halogen compound and a sulfur containing compound, and an active radiation oxidizing agent. As the organic halogen compound, all of the known organic halogen compounds as described, for example, in U.S. Pat. Nos. 3,042,515, 3,147,117, 3,113,024 and 3,502,476, Japanese Laid-Open-to-Public Patent Publication Nos. 45-4158, 45-12821 and 46-3696 which serve as the free radical-generating agent can effectively be used in this invention.

Typical examples of the organic halogen compound which generates a free-radical by virtue of the function of the active radiation, include the following compounds:

Compounds of general formula I

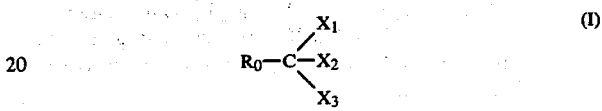

wherein $R_O$ represents an aryl, aralkyl, alkyl, alkenyl, benzoyl or aroyl group, a heterocyclic compound residue, hydrogen or halogen, or $R_O'-SO_2-$ or $R_O'-SO-$ (where $R_O'$ represents an aryl or alkyl group or a heterocyclic compound residue; and $X_1$, $X_2$ and $X_3$ each represent hydrogen hydrogen or halogen with the proviso that $X_1$, $X_2$ and $X_3$ cannot be hydrogen simultaneously. In the above, the groups and the residue include the substituted. Typical examples of the compound of formula (I) are:

carbon tetrachloride,
carbon tetrabromide,
p-nitrobenzotribromide,
bromotrichloromethane,
hexabromoethane,
benzotrichloride,
iodoform,
1,1,1-tribromo-2-methyl-2-propanol,
1,1,2,2-tetrabromoethane,
2,2,2-tribromoethanol,
1,1,1-trichloro-2-methyl-propanol,
o-nitro-α,α,α-tribromoacetophenone,
m-nitro-α,α,α-tribromoacetophenone,
p-nitro-α,α,α-tribromoacetophenone,
α,α,α-tribromoacetophenone,
α,α,α-m-tetrabromoacetophenone,
α,α,α-tribromo-3,4-dichloroacetophenone,
α,α,α-p-tetrabromoacetophenone,
α,α,α',α',α'-hexabromo-p-diacetylbenzene,
ω,ω,ω-tribromoquinaldine,
ω,ω-dibromoquinadine,
2-ω,ω,ω-tribromomethyl-4-methylquinoline,
ω,ω-dichloro-methyl-quinoline,
ω-bromolepidine,
2-ω-bromomethylisoquinoline,
4-ω,ω,ω-tribromo-methylpyrimidine,
4-phenyl-6-ω,ω-tribromomethyl-pyrimidine,
2-ω,ω-trichloromethyl-6-nitrobenzothiazole,
1-phenyl-3-ω,ω,ω-trichloro-5-methylpyrazole,
ω,ω,ω-tribromolepidine bromomethylate,
α-ω,ω-dibromomethyl-4-chloro-pyridine,
1-methyl-2-chloromethyl-benzimidazole,
2,5-di-tribromomethyl-3,4-dibromothiophene,
hexabromodimethylsulfoxide,
pentabromodimethylsulfoxide, hexabromodimethylsulfone,
trichloromethylphenylsulfone,
tribromomethylphenylsulfone,
trichloromethyl-p-chlorophenylsulfone,
tribromomethyl-p-nitrophenylsulfone,
2-trichloromethyl-benzothiazolylsulfone-(2),
4,6-dimethylpyrimidyl-2-tribromomethylsulfone,
tetrabromodimethylsulfone,
2,4-dichlorophenyltrichloromethylsulfone,
2-methyl-4-chlorophenyltrichloromethylsulfone,
2,5-dimethyl-4-chlorophenyltrichloromethylsulfone and
2,4-dichlorophenyltribromomethylsulfone.

Compounds of general formula II $$R-A-X \quad (II)$$

wherein R represents an alkyl or aryl group, A represents $-SO_2-$ or $-S-$ and X represents halogen. The groups include substituted alkyl or aryl respectively. Typical examples are:
1,3-benzenedisulfonylchloride,
2,4-dinitrobenzenesulfonylchloride,
o-nitrobenzenesulfonylchloride,
m-nitrobenzenesulfonylchloride,
3,3'-diphenylsulfonedisulfonylchloride,
ethanesulfonylchloride,
p-bromobenzenesulfonylchloride,
p-nitrobenzenesulfonylchloride,
p-iodobenzenesulfonylchloride,
p-acetamidobenzenesulfonylchloride,
p-chlorobenzenesulfonylchloride,
p-toluenesulfonylchloride,
methanesulfonylchloride,
benzenesulfonylchloride,
m-nitrobenzenesulfonylfluoride,
benzenesulfonylbromide,
2,4-dinitrobenzenesulfenylchloride and
o-nitrobenzenesulfenylchloride.

As the sulfur compound, those described, for example, in U.S. Pat. No. 3,285,744 are useful and compounds of the general formula $R_1-SH$ or $R_1-S-S-R_2$ (where $R_1$ and $R_2$ each represent an aryl or heterocyclic group), thiourea compounds, acyclicthioacetanilides and rhodanines are included;

Exemplified compounds include the followings:
2-mercaptobenzoxazole,
2-mercaptobenzothiazole,
2-mercaptobenzimidazole,
2-mercapto-6-nitrobenzothiazole,
2-mercaptothiazoline,
2-mercapto-4-phenylthiazole,
2-mercapto-1-methylimidazole,
1-phenyl-5-mercaptotetrazole,
2-mercapto-4,6,6-trimethylthiazine,
2-mercapto-4-phenylthiazole,
2-mercaptoquinoline,
2-mercapto-β-naphthothiazole,
2-mercapto-pyridine,
bis-(dimethylthiocarbamyl)disulfide,
2,2'-dithio-bis(benzothiazole)bis(3-phenyl-2-indolyl)disulfide,
rhodanine,
2,4-thiazolidinedione,
4-mercaptopyridine,
thioacetanilide,
α-mercaptoacetanilide and
thiocarbanilide.

As the active radiation oxidizing agent, those described, for example, in U.S. Pat. Nos. 3,615,568 and 3,920,457 as well as all of active radiation oxidizing agents which are known heretofore can effectively used and typical examples thereof include the following compounds:
3-ethyl-1'-methoxyoxa-2'-pyridocarbocyanine perchlorate,
1'-ethoxy-3-ethyloxa-2'-pyridocarbocyanine tetrafluoroborate,
3'-ethyl-1-methoxy-2-pyridothiacyanine iodate,
1-ethoxy-3'-ethyl-2-pyridothiacyanine tetrafluoroborate,
1-benzyloxy-3'-ethyl-2-pyridothiacyanine iodate,
3'-ethyl-1-methoxy-2-pyridothiacarbocyanine iodate,
1-ethoxy-3'-ethyl-2-pyridothiacarbocyanine tetrafluoroborate,
anhydrous 3'-ethyl-1-(3-sulfopropoxy)-2-pyridothiacarbocyanine hydroxide,
1-benzyloxy-3'-ethyl-2-pyridothiacarbocyanine perchlorate,
3'-ethyl-1-methoxy-2-pyridothiacarbocyanine perchlorate,
1'-methoxy-1,3,3-trimethylindo-2'-pyridocarbocyanine picrate,
3'-ethyl-1-methoxy-4',5'-benzo-2-pyridothiacarbocyanine perchlorate,
1-ethoxy-3'-ethyl-4',5'-benzo-2-pyridothiacarbocyanine tetrafluoroborate,
1'-ethoxy-3-ethyloxa-2'-carbocyanine tetrafluoroborate,
1'-ethoxy-3-ethylthia-2'-cyanine tetrafluoroborate,
1'-ethoxy-3-ethylthia-2'-carbocyanine tetrafluoroborate,
1'-ethoxy-3-ethylthia-2'-dicarbocyanine tetrafluoroborate,
1'-methoxy-3'-methyl-2-pyridothiazolinocarbocyanine perchlorate,
3'-ethyl-1-methoxy-4-pyridothiacyanine perchlorate,
3'-ethyl-1-methoxy-4-pyridothiacarbocyanine perchlorate,
1'-ethoxy-3-ethyl-4,5-benzothia-2'-carbocyanine tetrafluoroborate,
1-β-anilinovinyl-1-methoxypyridinium p-toluenesulfonate,
1-ethyl-1'-methoxy-4,5-benzothia-4'-carbocyanine perchlorate,
1-methoxy-2-methylpyridinium p-toluenesulfonate,
1-methoxy-4-methylpyridinium p-toluenesulfonate,
anhydrous 2-methyl-1-(3-sulfopropoxy)pyridinium hydroxide,
1-ethoxy-2-methylpyridinium tetrafluoroborate,
1-benzyloxy-2-methylpyridinium bromide,
1-ethoxy-2-methylquinolinium tetrafluoroborate,
1,1'-ethylenedioxybispyridinium dibromide,
1,1'-trimethylenedioxybispyridinium dibromide,
1,1'-tetramethylenedioxybis(2-methylpyridinium)dibromide,
1,1'-tetramethylenedioxybis(4-methylpyridinium)dibromide,
1,1'-tetramethylenedioxybispyridinium dibromide,
1,1'-pentamethylenedioxybispyridinium dibromide,
1-acetoxy-2-(4-dimethylaminostyryl)pyridinium perchlorate,
1-benzoyloxy-2-(4-dimethylaminostyryl)pyridinium perchlorate,
1,3-diethyl-5-[(1-methoxy-2(1H)-pyridylidene)ethylidene]-2-thiobarbituric acid, 3-ethyl-5-[(1-methoxy-2(1H)-pyridylidene)ethylidene]r-hodamine,
1,3-diethyl-5-[(1-methoxy-2(1H)-pyridylidene)ethylidene]barbituric acid,
2-(3,3-dicyano alkylidene 1,1-methoxy-1,2-dihydropyridine,
2-[(1-methoxy-2(1H)-pyridylidene)-ethylidene]benzo[6]-thiophene-3(2H)-on-1,1-dioxide,
3-cyano-5-[(1-methoxy-2(1H)-pyridylidene)ethylidene)-4-phenyl-2(5H)-furanone,
N-ethoxy-2-picoliniumiodide,
N-ethoxy-2-picoliniumhexafluorophosphate and
N-methoxy-2-anilinovinylpyridinium p-toluenesulfonate.

Additionally, hexaarylbisimidazoles as described in U.S. Pat. No. 3,697,280 are also useful. Among those photo-activating components, those which are preferably used in this invention are free radical-generating agent as above defined and among them, an organic halogen compound is more preferable and the most preferable as the polyhalogen compounds are $CBr_4$, $CHI_3$, $\alpha,\alpha,\alpha$-tribromoacetphenone, tribromomethylphenylsulfon, etc.

In the present invention, the term "a colorable or decolorable component" means a compound which is able to be changed from the native colorless state to colored state or vice versa, by the reaction with a compound having a free-radical or oxidative component produced from the above-defined activating agent by active irradiation, the color after the reaction being capable of transferring an energy, absorbed thereby, to the light-sensitive resin enough for the polymerization thereof when exposed to light which can be absorbed by the color. More preferably, the energy absorbed by the color can also be transferred to the activating agent for the activation thereof whereby the activated agent further reacts with the colorable or decolorable component to form the additional color which amplified the activation of the activating agent and the polymerization of the light-sensitive resin as well.

In the present invention, as the colorable or decolorable component, such compound as being able to vary into the colored state, i.e. a color-forming component yields a more preferable result.

As such the colorable or decolorable agent, any of the compounds known heretofore which is colored or decolored itself by means of the reaction with the abovementioned activated activating component can be used in this invention. For example, an arylamine, an N-vinyl compound, a styryl, cyanine or merocyanine dye base, or a leuco compound is useful.

As the arylamine, compounds as described, for example, in U.S. Pat. Nos. 3,042,515, 3,510,304 and 3,147,117 and Japanese Laid-Open-to-Public Patent Publication Nos. 47-8103 and 44-2002, etc. are useful and typical examples of such compounds include aniline, diphenylamine, o-toluidine, N,N'-diphenyl-p-phenylenediamine, N,N'-diphenylethylenediamine, p-hydroxydiphenylamine, p-aminodiphenylamine, p,p'-diaminodiphenylmethane, indole, 2-methylindole, 2-phenylindole, triphenylimidazole, a condensation product of pyrrole and aldehyde, a condensation product of indole, aldehyde and piperidine, a condensation product of pyrazolone and aldehyde, and 1,1-bis(p-dimethylaminophenyl)ethylene.

As the N-vinyl compounds, compounds as described in, for example, U.S. Pat. Nos. 3,042,517 and 3,476,562 are useful, and the typical examples include N-vinylcarbazole, N-vinylphenyl-α-naphthylamine, N-vinyl diphenylamine, N-vinylindole, N-vinylpyrrole, N-vinyl pyrrolidene, N-vinyl succin imide, N-vinylacetanilide, N-vinylphenylacetamide, N-vinylmethlyacet-azide, N-vinyldiglycolyliside and N-vinylphthaliside. Further, compounds comprising as the basic skeleton, for example, N-vinylbenzothiazolidine, N-vinylbenzoxazolone and N-vinylbenzotriazole are useful.

As the styryl, cyanine, or merocyanine dye base compounds as described, for example, in U.S. Pat. Nos. 3,100,703, 3,102,810, 3,095,303, 3,102,027 and 3,109,736 are useful and the typical examples of such compounds include the followings:
4-p-dimethylaminostyrylquinoline,
2-p-dimethylaminostyrylquinoline,
2-p-dimethylaminostyrylbenzothiazole,
2-p-dimethylaminostyrylbenzothiazole,
2-[3-(1-ethyl-2(1H)-quinolidene)propenyl]quinoline,
2-[2-methyl-3-(3-ethyl-2(3H)-benzothiazolylidene)-propenyl]benzothiazole,
4-[(1-ethyl-2(1H)-quinolylidene)methyl]quinoline,
2-[1-cyano-5-(1-ethyl-2(2H)-quinolylidene)-1,3-pentadiethyl]quinoline,
2- [7-(3-ethyl-2(3H)-benzothiazolylidene)-1,3,5heptatrienyl]benzothiazole,
2-[3-(3-ethyl-2(3H)-benzoxazolylidene)propenyl]quinoline,
4-(2-methyl-3-(1-ethyl-2(1H)-quinolylidene)propenyl]quinoline,
4-[1-cyano-5-(3-methyl-2(3H)-benzothiazolylidene)-1,3-pentadienyl)quinoline,
4-[(3-ethyl-2(3H)-benzothiazolylidene]methylquinoline,
3-ethyl-5-[(3-ethyl-2(3H)-benzoxazolylidene)ethylidene]rhodanine,
1-ethyl-3-[(3-ethyl-2(3H)-benzoxazolidene)ethylidene]oxyindole,
4-[(3-ethyl-2(3H)-benzoxazolidene)-ethylidene]-3-pentyl-5(4H)-isoxazole,
3-ethyl-5-[(1-methyl-4(1H)-quinolidene)ethylidene]rhodanine and
5-[(1-methyl-4(1H)-quinolidene)-ethylene]-2-methyl-mercapto-4-(5)-thiazolone-p-toluenesulfonate.

As the Leuco compounds, those described, for example, in U.S. Pat. Nos. 3,121,632, 3,102,029, 3,615,568, 3,342,595 and 3,342,604 are useful and the typical examples thereof includes the followings:

I. Leuco Dye a. aminotriarylmethanes bis(4-amino-2-butylphenyl)(p-dimethylaminophenyl)methane,
bis(4-amino-2-chlorophenyl)(p-aminophenyl)methane,
bis(4-amino-3-chlorophenyl)(o-chlorophenyl)methane,
bis(4-amino-3-chlorophenyl)phenylmethane,
bis(4-amino-3,5-diethylphenyl)(o-chlorophenyl)methane,
bis(4-amino-3,5-diethylphenyl)(o-ethoxyphenyl)methane,
bis(4-amino-3,5-diethylphenyl)(p-methoxyphenyl)methane,
bis(4-aminoethylphenyl)(o-chlorophenyl)methane,
bis(p-aminophenyl)(4-amino-m-tolyl)methane,
bis(p-aminophenyl)(o-chlorophenyl)methane,
bis(p-aminophenyl)(p-chlorophenyl)methane,
bis(p-aminophenyl)(2,4-dichlorophenyl)methane,
bis(p-aminophenyl)(2,5-dichlorophenyl)methane,
bis(p-aminophenyl)(2,6-dichlorophenyl)methane,
bis(p-aminophenyl)phenylmethane-9-methylacridine, bis(4-amino-tolyl)(p-chlorophenyl)methane,
bis(4-amino-o-tolyl)(2,4-dichlorophenyl)methane,
bis(p-anilinophenyl)(4-amino-m-tolyl)methane,
bis(4-benzylamino-2-cyanophenyl)(p-aminophenyl)methane,
bis(p-benzylethylaminophenyl)(p-chlorophenyl)methane,
bis(p-benzylethylaminophenyl)(p-diethylaminophenyl)methane,
bis(p-benzylethylaminophenyl)(p-dimethylaminophenyl)methane,
bis(4-benzylethylamino-o-tolyl)(p-methoxyphenyl)methane,
bis(p-benzylethylaminophenyl)phenylmethane,
bis(4-benzylethylamino-o-tolyl)(o-chlorophenyl)methane,
bis(4-benzylethylamino-o-tolyl)(p-diethylaminophenyl)methane,
bis(4-benzylethylamino-o-tolyl)(4-diethylamino-o-tolyl)methane,
bis(4-benzylethylamino-o-tolyl)(p-dimethylaminophenyl)methane,
bis[2-chloro-4-(2-diethylaminoethyl)ethylaminophenyl](o-chlorophenyl)methane,
bis[p-bis(2-cyanoethyl)aminophenyl]phenylmethane,
bis[p-(2-cyanoethyl)ethylamino-o-tolyl](p-dimethylaminophenyl)methane,
bis[p-(2-cyanoethyl)methylaminophenyl](p-diethylaminophenyl)methane,
bis(p-dibutylaminophenyl)[p-(2-cyanoethyl)methylaminophenyl]methane,
bis(p-dibutylaminophenyl)(p-diethylaminophenyl)methane,
bis(4-diethylamino-2-butoxyphenyl)(p-diethylaminophenyl)methane,
bis(4-diethylamino-2-chlorophenyl)o-tolylmethane,
bis(p-diethylaminophenyl)(p-aminophenyl)methane,
bis(p-diethylaminophenyl)(4-amino-1-naphthyl)methane,
bis(p-diethylaminophenyl)(m-butoxyphenyl)methane,
bis(p-diethylaminophenyl)(o-chlorophenyl)methane,
(p-diethylaminophenyl)(p-cyanophenyl)methane,
bis(p-diethylaminophenyl)(o-chlorophenyl)methane,
bis(p-diethylaminophenyl)(p-cyanophenyl)methane,
bis(p-diethylaminophenyl)(2,4-dichlorophenyl)methane,
bis(p-diethylaminophenyl)(4-diethylamino-1-naphthyl)methane,
bis(p-diethylaminophenyl)(p-dimethylaminophenyl)methane,
bis(p-diethylaminophenyl)(4-ethylamino-1-naphthyl)methane,
bis(p-diethylaminophenyl)-2-naphthylmethane,
bis(p-diethylaminophenyl)(p-nitrophenyl)methane,
bis(p-diethylaminophenyl)-2-pyridylmethane,
bis(p-diethylamino-m-tolyl)(p-diethylaminophenyl)methane,
bis(4-diethylamino-o-tolyl)(o-chlorophenyl)methane,
bis(4-diethylamino-o-tolyl)(p-diethylaminophenyl)methane,
bis(4-diethylamino-o-tolyl)(p-diphenylaminophenyl)methane,
bis(4-diethylamino-o-tolyl)phenylmethane,
bis(4-dimethylamino-2-bromophenyl)phenylmethane,
bis(p-dimethylaminophenyl)(4-amino-1-naphthyl)methane,
bis(p-dimethylaminophenyl)(p-butylaminophenyl)methane,
bis(p-dimethylaminophenyl)(p-sec.-butylethylaminophenyl)methane,
bis(p-dimethylaminophenyl)(p-chlorophenyl)methane,
bis(p-dimethylaminophenyl)(p-diethylaminophenyl)methane,
bis(p-dimethylaminophenyl)(4-dimethylamino-1-naphthyl)methane,
bis(p-dimethylaminophenyl)(6-dimethylamino-m-tolyl)methane,
bis(p-dimethylaminophenyl)(4-dimethylamino-o-tolyl)methane,
bis(p-dimethylaminophenyl)(4-ethylamino-1-naphthyl)methane,
bis(p-dimethylaminophenyl)(p-hexyloxyphenyl)methane,
bis(p-dimethylaminophenyl)(p-methoxyphenyl)methane,
bis(p-dimethylaminophenyl)(5-methyl-2-pyridyl)methane,
bis(p-dimethylaminophenyl)2-quinolylmethane,
bis(p-dimethylaminophenyl)o-tolylmethane,
bis(p-dimethylaminophenyl)(1,3,3-trimethyl-2-indolinylidenemethyl)methane,
bis(4-dimethylamino-o-tolyl)(p-aminophenyl)methane,
bis(4-dimethylamino-o-tolyl)(o-bromophenyl)methane,
bis(4-dimethylamino-o-tolyl)(o-cyanophenyl)methane,
bis(4-dimethylamino-o-tolyl)(o-fluorophenyl)methane,
bis(4-dimethylamino-o-tolyl)1-naphthylmethane,
bis(4-dimethylamino-o-tolyl)phenylmethane,
bis(p-ethylaminophenyl)(o-chlorophenyl)methane,
bis(4-ethylamino-m-tolyl)(o-methoxyphenyl)methane,
bis(4-ethylamino-m-tolyl)(o-methoxyphenyl)methane,
bis(4-ethylamino-m-tolyl)(p-dimethylaminophenyl)methane,
bis(4-ethylamino-o-tolyl)(p-hydroxyphenyl)methane,
bis[4-ethyl(2-hydroxyethyl)amino-m-tolyl](p-diethylaminophenyl)methane,
bis[p-(2-hydroxyethyl)aminophenyl](o-chlorophenyl)methane,
bis[p-bis(2-hydroxyethyl)aminophenyl](4-diethylamino-o-tolyl)methane,
bis[p-(2-methoxyethyl)aminophenyl]phenylmethane,
bis(p-methylaminophenyl)(p-hydroxyphenyl)methane,
bis(p-propylaminophenyl)(m-bromophenyl)methane,
tris(4-amino-o-tolyl)methane,
tris(4-anilino-o-tolyl)methane,
tris(p-benzylaminophenyl)methane,
tris[4-bis(2-cyanoethyl)amino-o-tolyl]methane,
tris[p-(2-cyanoethyl)ethylaminophenyl]methane,
tris(p-dibutylaminophenyl)methane,
tris(p-di-tert.-butylaminophenyl)methane,
tris(p-dimethylaminophenyl)methane,
tris(4-diethylamino-2-chlorophenyl)methane,
tris(p-diethylaminophenyl)methane,
tris(4-diethylamino-o-tolyl)methane,
tris(p-dihexylamino-o-tolyl)methane,
tris(4-dimethylamino-o-tolyl)methane,
tris(p-hexylaminophenyl)methane,
tris[p-bis(2-hydroxyethyl)aminophenyl]methane,
tris(p-methylaminophenyl)methane, and
tris(p-dioctadecylaminophenyl)methane.

b. Aminoxanthenes 3-amino-6-dimethylamino-2-methyl-9-(o-chlorophenyl)xanthene,
3-amino-6-dimethylamino-2-methyl-9-phenylxanthene,
3-amino-6-dimethylamino-2-methylxanthene,
3,6-bis(diethylamino)-9-(o-chlorophenyl)xanthene, 3,6-bis(diethylamino)-9-hexylxanthene,
3,6-bis(diethylamino)-9-(o-methoxycarbonylphenyl)xanthene,
3,6-bis(diethylamino)-9-methylxanthene,
3,6-bis(diethylamino)-9-phenylxanthene,
3,6-bis(diethylamino)-9-o-tolylxanthene,
3,6-bis(diethylamino)-9-(o-chlorophenyl)xanthene,
3,6-bis(dimethylamino)-9-ethylxanthene,
3,6-bis(dimethylamino)-9-(o-methoxycarbonylphenyl)xanthene,
3,6-bis(dimethylamino)-9-methylxanthene, c. Aminothioxanthenes 3,6-bis(diethylamino)-9-(o-ethoxycarbonylphenyl)thioxanthene,
3,6-bis(dimethylamino)-9-(o-methoxycarbonylphenyl)thioxanthene,
3,6-bis(dimethylamino)thioxanthene,
3,6-dianilino-9-(o-ethoxycarbonyl)thioxanthene, d. Amino-9,10-dihydroacridines 3,6-bis(benzylamino)-9,10-dihydro-9-methylacridine,
3,6-bis(diethylamino)-9-hexyl-9,10-dihydroacridine,
3,6-bis(diethylamino)-9,10-dihydro-9-methylacridine,
3,6-bis(diethylamino)-9,10-dihydro-9-phenylacridine,
3,6-diamino-9-hexyl-9,10-dihydroacridine,
3,6-diamino-9,10-dihydro-9-methylacridine,
3,6-diamino-9,10-dihydro-9-phenylacridine,
3,6-bis(dimethylamino)-9-hexyl-9,10-dihydroacridine,
3,6-bis(dimethylamino)-9,10-dihydro-9-methylacridine, e. Aminophenoxyazines 3,7-bis(diethylamino)phenoxazine-9-dimethylaminobenzo[a]phenoxazine, f. Aminophenothiazines 3,7-bis(benzylamino)phenothiazine g. Aminodihydrophenazines 3,7-bis(benzylethylamino)-5,10-dihydro-5-phenylphenazine,
3,7-bis(diethylamino)-5-hexyl-5,10-dihydrophenazine,
3,7-bis(dihexylamino)-5,10-dihydrophenazine,
3,7-bis(dimethylamino)-5-(p-chlorophenyl)-5,10-dihydrophenazine,
3,7-diamino-5-(o-chlorophenyl)-5,10-dihydrophenazine,
3,7-diamino-5,10-dihydrophenazine,
3,7-diamino-5,10-dihydro-5-methylphenazine,
3,7-diamino-5-hexyl-5,10-dihydrophenazine,
3,7-bis(dimethylamino)-5,10-dihydrophenazine,
3,7-bis(dimethylamino)-5,10-dihydro-5-phenylphenazine,
3,7-bis(dimethylamino)-5,10-dihydro-5-methylphenazine, h. Aminophenylmethanes 1,4-bis[bis-p(diethylaminophenyl)methyl]piperazine,
bis(p-diethylaminophenyl)anilinomethane,
bis(p-diethylaminophenyl)-1-benzotriazolylmethane,
bis(p-diethylaminophenyl)-2-benzotriazolylmethane,
bis(p-diethylaminophenyl)(p-chloroanilino)methane,
bis(p-diethylaminophenyl)(2,4-dichloroanilino)methane,
bis(p-diethylaminophenyl)(methylamino)methane,
bis(p-diethylaminophenyl)(octadecylamino)methane,
bis(p-dimethylaminophenyl)aminomethane,
bis(p-dimethylaminophenyl)anilinomethane,
bis(p-dimethylaminophenyl)phenylmethane,
1,1-bis(dimethylaminophenyl)ethane,
1,1-bis(dimethylaminophenyl)heptane,
bis(4-methylamino-m-tolyl)aminoethane,
bis(p-dimethylaminophenyl)hydroxylmethane, i. Leuco-indamines 4-amino-4'-dimethylaminodiphenylamine and
p-(p-dimethylaminoanilin)phenol.

j. Aminohydrocinnamic acids (cyanoethanes, leuco-methines)

4-amino-α,β-dicyanohydrocinnamic acid methyl ester,
4-amino-α,β-dicyanohydrocinnamic acid methyl ester,
4-(p-chloroanilino)-α,β-dicyanodihydrocinnamic acid methyl ester,
α-cyano-4-dimethylaminohydrocinnamic acid amide,
α-cyano-4-dimethylaminohydrocinnamic acid methyl ester,
α,β-dicyano-4-diethylaminohydrocinnamic acid methyl ester,
α,β-dicyano-4-dimethylaminohydrocinnamic acid amide,
α,β-dicyano-4-dimethylaminohydrocinnamic acid methyl ester and
α,β-dicyano-4-dimethylaminohydrocinnamic acid.

II. Acyl derivative of leuco dye containing a basic NH group

Pertinent compounds which contains a basic NH group and forms an amide on acylation, including, additionally, dihydrophenazines, phenothiazines and phenoxazines. Representative compounds of this type include the followings:
10-acetyl-3,7-bis(dimethylamino)phenothiazine,
10-(p-chlorobenzoyl)-3,7-bis(diethylamino)phenothiazine,
5,10-dihydro-10-(p-nitrobenzoyl)-5-phenyl-3,7-bis(phenylethylamino)phenazine and
10-(p-benzoyl)-3,7-bis(naphthylmethylamino)phenoxazine.

III. Leuco-like compounds containing no oxidizable hydrogen atom but being able to be oxidized to a color developing compound Representative compounds of this type include the followings:
tris-(p-dimethylaminophenyl)-benzylthiomethane,
1-tris(p-diethylaminophenyl)methyl-2-phenylhydrazine,
tris(4-diethylamino-o-tolyl)ethoxycarbonylmethane,
bis(4-dipropylamino-o-tolyl)-(o-fluorophenyl)butoxycarbonylmethane,
bis[tris(4-diethylamino-o-tolyl)methyl]disulfide,
α,β-dicyano-4-dimethylaminohydrocinnamic acid, hexyl ester,
α,β-dicyano-4-hexylaminohydrocinnamic acid, methyl ester,
α,β-dicyano-4-hexylaminohydrocinnamic acid, methyl ester,
α,β-dicyano-4-methylaminocinnamic acid, methyl ester,
p-(2,2-dicyanoethyl)-N,N-dimethylaniline,
4-methoxy-4'-(1,2,2-tricyanoethyl)azobenzene,
4-(1,2,2-tricyanoethyl)azobenzene,
p-(1,2,2-tricyanoethyl)-N,N-dimethylaniline, k. Hydrazines 1-(p-diethylaminophenyl)-2-(2-pyridyl)hydrazine,
1-(p-dimethylaminophenyl)-2-(2-pyridyl)hydrazine,
1-(3-methyl-2-benzothiazole)-2-(4-hydroxy-1-naphthyl)hydrazine,
1(2-naphthyl)-2-phenylhydrazine,
1-p-nitrophenyl-2-phenylhydrazine and
1-(1,3,3-trimethyl-2-indolinyl)-2-(3-N-phenylcarbamoyl-4-hydroxy-1-naphthyl)hydrazine.

l. Leuco-indigoid dye m. Amino-2,3-dihydroanthraquinones 1,4-dianilino-2,3-dihydroanthraquinone and
1,4-bis(ethylamino)-2,3-dihydroanthraquinone.

n. Phenethylanilines

N-(2-cyanoethyl)-p-phenethylaniline,
N,N-diethyl-p-phenethylaniline and
N,N-dimethyl-p-[2-(1-naphthyl)ethyl]aniline.

o. Leuco-dihydroanthracene 2,7-bis(dimethylamino)-10-p-dimethylaminophenyl-9,10-dihydro-9,9-dimethylanthracene,
2,7-bis(dimethylamino)-9,10-dihydro-9,9-dimethylanthracene,
2,7-bis(dimethylamino)-10-ethyl-9,10-dihydro-9,9-dimethylanthracene and, in addition, a fluoran dye and spiro-pyran dye are also useful.

Among the above-mentioned color-forming components, those which are particularly preferable for use in this invention are leuco-crystal-violet (tris(p-dimethylaminophenyl)methane), leuco-malachite green (bis(p-dimethylaminophenyl)phenylmethane), N-vinyl carbazole, Michler's hydrol (bis(p-dimethylaminophenyl)hydroxylmethane), 4-(p-dimethylaminostyryl)-quinoline, a xanthene dye and fluoran dye.

Photo-polymerizable light-sensitive resins include compounds which increase in the molecular weights thereof by being polymerized or cross-linked through light or compounds which vary in the chemical or physical properties thereof by being decomposed or reacted through light.

As such light-sensitive resin, any of known light-sensitive resins which vary as explained above through light can be used in this invention and as useful ones, there can be included an addition polymerizable unsaturated compound, an $\alpha,\beta$-unsaturated ketone compound, an azido compound and a diazo compound.

The term "addition polymerizable unsaturated compounds" means such unsaturated compounds that can be addition-polymerized through light and, for example, ethylenically unsaturated compounds as described in U.S. Pat. Nos. 2,927,022 and 3,060,023 are useful. These compounds are preferably monomeric, have a melting point higher than 90° C. under an atmospheric pressure and contain at least one terminal ethylenic group, and 2–5 terminal ethylenic groups may be contained.

Suitable unsaturated compounds include an unsaturated ester of polyol, in particular, for example, esters of $\alpha$-methylenecarboxylic acid, e.g. ethylene glycol diacrylate, diethylene glycol diacrylate, glycerol diacrylate, glyceryl triacrylate, mannitol polyacrylate, sorbitol polyacrylate, ethylene glycol dimethaarylate, 1,3-propanediol dimethacrylate, 1,2,4-butanetriol trimethacrylate, trimethylolpropane triacrylate, triethylene glycol diacrylate, 1,4-cyclohexanediol diacrylate, 1,4-benzenediol dimethacrylate, pentaerythritol di-, tri- and tetra-methacrylate, dipentaerythritol polyacrylate, pentaerythritol di-, tri- and tetra-acrylate, 1,3-propanediol diacrylate, 1,5-pentanediol dimethacrylate, bisacrylate and methacrylate of polyethylene glycol of molecular weight of 200-4000 as well as an unsaturated amide, particularly unsaturated amide of $\alpha$-methylenecarboxylic acid, in particular, unsaturated amide of $\alpha,\omega$-diamine and oxygen-interrupted $\omega$-diamine, for example, methylenebisacrylamide, methylenebismethacrylamide, ethylenebismethacrylamide, 1,6-hexamethylenebisacrylamide, bis($\gamma$-methacrylamidepropoxy)-ethane and $\beta$-methacrylamideethylmethacrylate, a vinyl ester, for example, divinyl succinate, divinyl adipate, divinyl phthalate, divinyl terephthalate, divinyl benzene-1,3-disulfonate and divinyl butane-1,4-disulfonate, styrene and its derivative, and an unsaturated aldehyde, for example, hexadienal.

As unsaturated compounds preferable due to desirable physical properties of a composition containing such compounds, there can be mentioned,
N-phenyl-N-methylacrylamide,
N-vinylphthalimide,
diacetone acrylamide,
N-vinylsuccinimide,
p-xylenediacrylate,
1,4-bis(2-acryloxyethyl)benzene,
pentaerythritol triacrylate,
4-acryloxybenzophenone,
4-methacryloxybenzophenone,
N-(2-acryloxyethyl)succinimide,
trimethylolpropane triacrylate,
pentaerythritol tetraacrylate,
triethylene glycol diacrylate,
triethylene glycol dimethacrylate,
trimethylolpropane trimethacrylate,
4-acryloxydiphenylmethane,
N-(2-acryloxypropyl)succinimide,
2,4-diacryloxybenzophenone,
4-($\alpha,\alpha$-dimethylbenzyl)phenylacrylate,
3-acryloxybenzophenone,
2-acryloxybenzophenone and
2-acryloxy-4-octyloxybenzophenone.

As known light-sensitive resins such as an $\alpha,\beta$-unsaturated ketone, an amide compound and a diazo compound, those described, for example, in U.S. Pat. Nos. 2,610,120, 2,751,296, 2,861,058, 3,096,311, 2,922,715 and 3,690,890 and British Pat. No. 1,125,194 are useful and the typical examples thereof are as follows: Polyvinyl cinnamate, polyvinyl alcohol cinnamate phthalate, polyvinyl alcohol cinnamate succinate, polyvinyl acetate 3-azidophthalate, polyvinyl acetate p-azidobenzoate, styrene-maleic anhydride m-azidobenzoate, mixture of phenol novolak resin and phenylene diazide, a condensation product of p-diazodiphenylamine and paraformaldehyde, a condensation product of m-cresol novolak resin and o-naphthoquinone diazide-4-sulfonylchloride, N-ethyl-N-phenylaminoethylmethacrylatemethacrylic acid copolymer, etc.

In the present invention, the afore-mentioned addition-polymerizable unsaturated compounds, in particular, ethylenically unsaturated compounds provide preferable results.

The light-sensitive layer comprises as its essential constitution components, an activating component, a colorable or decolorable component and a light-sensitive resin.

The ratio by weight of the activating component, the colorable or decolorable component and the light-sensitive resin is desirably, based on 100 parts by weight of the light-sensitive resin, 500-10 parts by weight of the photo-activating component and 100-1 parts by weight of the colorable or decolorable component.

There may be used two or more of each of the photo-activating component, the colorable or decolorable component and the light-sensitive resin, or alternatively a part or whole of each of the above components may be combined in one molecule.

If necessary, additives other than the aforementioned three essential components may be added to the light-sensitive layer.

If necessary, a known preserving and stabilizing agent can be added. As examples of the preserving and stabilizing agent, there are included, for example, 5,6-isopropylideneascorbic acid, p-aminophenol, polyethyleneoxide of 2,6-di-tert.-butylphenol aromatic amine, 4-phenylpyridine N-oxide, methylmethacrylate-glycidyl methacrylate copolymer, 2,6-di-tert.-butyl-cresol, dicitric acid, pyromellitic acid, cholic acid, cholesterol tetrachlorophthalic acid, methyl m-hydroxybenzoate, and dimethyl phthalate.

If necessary, it is possible to add a known color development accelerator. Examples of the color development accelerator include, for example, benzoquinoline, N-oxide, ferrocene, N,N-diethyldithiocarbamic acid dimethylammonium, tetrathiuramdisulfide and p-dimethylaminobenzaldehyde.

Further, if necessary, it is possible to add a known film-forming binder and as examples of such binder, there can be mentioned various natural or synthetic resin and solid paraffin-series hydrocarbon such as gelatine, polyvinyl alcohol, polystyrene, polymethyl methacrylate, polyvinyl chloride and chlorinated rubber.

Further, if necessary, a known sensitizing agent, for example, 1,5-diphenyl-3-methyl-pyrazoline, benzaldehydebenzoylhydrazone, 2,4,6-triphenylpyrylium perchlorate and Michler's ketone can be added.

These additives can be used alone or in combination.

In preparation of the light-sensitive layer, the aforementioned essential components and, if necessary, the other additives may be dissolved in a suitable solvent and coated on a support. Alternatively, the above components and, if necessary, additives may be formulated per se in a film form and then dried by means of a pertinent method to give a light-sensitive layer. In the latter case, a support-free light-sensitive material is provided.

Thickness of the light-sensitive layer is generally from $0.5\mu$ to 2 mm and more preferably is $1-30\mu$.

In the former method of the preparation of the light-sensitive layer, for example, methyl cellosolve, ethyl cellosolve, dioxane, acetone, methyl ethyl ketone, cyclohexane, $\gamma$-butyrolactone, tetrahydrofuran, methylene chloride, ethylene chloride, dimethylsulfoxide or dimethylformamide is suitable as the solvent for coating.

As the support, there can be used an aluminum plate, a zinc plate, a copper plate, a plastic film, a paper or a bimetallic- or trimetallic laminated plate.

Further, if necessary, a known sublayer may be coated on the surface of the support.

Furthermore, it is possible, if necessary, to arrange a protective film on the light-sensitive layer. As the protective film are suitable such materials as used as support as defined above and polyethylene terephthalate, polypropylene, polyethylene, cellulose triacetate, cellulose diacetate, polyvinyl chloride, polyvinyl alcohol, polycarbonate, polystyrene, cellophane, polyvinylidene chloride copolymer, polyamide, polyimide, vinyl chloride-vinyl acetate, copolymer, polytetrafluoroethylene, polytrichloroethylene, carboxymethylcellulose, methoxycellulose, polyvinyl pyrrolidone, polyethylene glycol, acrylic acid, maleic anhydride copolymer, etc. Thickness of the protective film is generally $8-80\mu$ and more preferably $10-50\mu$.

With the light-sensitive materials thus prepared, the photo-polymerized image of this invention is formed according to the following process:

The first step comprises irradiation with an active ray and the irradiation is preferably effected by means of imagewise exposure.

The active ray means such ray that is active to the photo-activating component which is an essential component of the light-sensitive layer and is UV or visible light having a wavelength within the range of preferably 300-700 nm, more preferably 340-500 nm. Said UV or visible light may be either monochromatic light or continuous light. Further, it may be an electron beam or X-ray. The amount of the active ray to be irradiated can easily be decided by those skilled in the art on the basis of their experience within the range where, depending upon the degree of activation of the photo-activating component, coloration or decoloration is caused by the reaction with the discoloring component.

In the present invention, coloration or decoloration may be caused at such degree where coloration or decoloration occurs as only a latent image even which can be effective for such second step as mentioned before.

As the source of the active radiation, various materials can be used. When the active radiation is UV or visible light, for example, a tungsten lamp, a high pressure mercury lamp, a xenon lamp, a carbon arc lamp, a halogen lamp, a fluorescent lamp or laser can generally be used. In addition, an electron beam or X-ray source as generally used may be used.

By means of the irradiation of the active ray as the first step, a free-radical or oxidative compound is produced from the activating component and the free-radical or oxidative compound is then reacted with the colorable or decolorable component.

In general, the first step is preferably imagewise irradiation through an original and in accordance with the imagewise irradiation, production of a colored compound or decolorization of a colored compound corresponding to the image is caused. Thereafter, as the second step as defined later, irradiation on the whole surface is uniformly effected.

Alternatively, the irradiation of the first step may be effected so that the irradiation on the whole surface is uniform. In this case, however, the exposure in the second step as defined later is imagewise. In this case, the colorable component is preferably employed.

In this invention, light used for the second step is such that is within the range of wavelength which is absorbed by the colored compound or the unreacted decolorable component.

Said light is further not only included within the range of wavelength which is absorbed by the above-mentioned colored compound but also included within the range of wavelength and the range of light quantity which does not substantially vary the activating component and the light-sensitive resin. Where the effect of this invention is achievable is when the irradiation of the first step is carried out imagewise and as the second step, exposure uniform on the whole surface is carried out.

Said light is generally, when the active radiation is a light, one of longer wavelength than that used as the active radiation and is preferably yellow-red light of 500–800 nm of wavelength. The wavelength and quantity of light can easily be selected in view of the composition of the light-sensitive layer. As the light source, in addition to an ordinary light source accompanied with a pertinent filter, an IR-lamp, a He-Ne-laser, a semiconductor laser, LED or the like can be used.

The colored compound absorbs the above-mentioned light and transmits the energy to the afore-mentioned activating component and/or light-sensitive resin to yield as a result a photo-polymerized image.

Although the mechanism therefor is not clearly established, it is considered that, probably, as a result of transmission of the photo-energy absorbed in the colored compound to the light-sensitive resin, said light-sensitive resin is polymerized or cross-linked or is decomposed or the like. In the present invention, a colorable or decolorable component which is natively colorless (i.e. color-forming component) is preferably used. In this case, the absorbed photo-energy is simultaneously transmitted also to the activating component and this activating component is further reacted with the colorable or decolorable component, resulting in further prosecution of the coloration and consequently increase in the amount of energy absorbed in the colored compound. Thus, formation of photo-polymerized image will be more increased.

According to the present invention, the advantage thereof will satisfactorily be exhibited when the activating component is a free-radical generating agent, and actually excellent effect is attainable.

In this case, it is considered that the light absorbed in the colored compound according to the second step is transmitted not only to the light-sensitive resin but also to the free-radical generating agent and the free-radical generating agent which has received energy generates a free-radical, and this free-radical is reacted with the colorable or decolorable component to prosecute further the coloration and, as the quantity of light absorbed is increased, said free-radical is reacted also with the light-sensitive resin, increasing thereby formation of the photo-polymerized image more and more.

The intrinsic absorption wavelength ranges of the activating component and the light-sensitive resin itself may be the same or closely related. In such case, it is considered that hardening of the light-sensitive resin is caused at the same time as the coloration or decoloration due to the irradiation of the first step (particularly, exposure to UV or visible light). However, since the reaction speed of the coloration or decoloration reaction is faster than that of the hardening, such hardening of the light-sensitive resin is not almost caused or is caused little, if any, even under the above-mentioned situation. In other words, in the present invention, a very slight hardening of the light-sensitive resin caused by the first exposure can be amplified by the second exposure through a light of preferably longer wavelength and it is possible to highly increase the hardness of the polymerized image by increasing the quantity of light used for the second exposure whereby the total sensitivity is increased.

In the present invention, the density of the image obtainable in the first step may be increased according to the photo-development amplifying method as described in Japanese Laid-Open-to-Public Patent Publication No. 49-16437 and thereafter the second step may be carried out. According to the above method, a small amount of colored compound formed in the portion where the imagewise exposure was applied is amplified by absorption of the energy of the light used for the second exposure. This procedure is able to further decrease the quantity of light for the first imagewise exposure, whereby the practice of the present invention is made more advantageous.

In carrying out the second step, heat may be applied to the light-sensitive layer.

Photo-polymerized image obtainable by the above process can be additionally processed by an appropriate method to provide a relief image or a more preferable visible image.

As such the processing method, is useful, for example, a process for forming a relief image by dissolving and removing the un-exposed portion by using water, an aqueous alkali solution, an organic solvent or a mixture thereof, or a process for forming a relief image according to the stripping type development process as described, for example, in U.S. Pat. Nos. 3,607,264, 3,784,378 and 3,573,918 and German Pat. Nos. 2,149,025 and 2,543,009.

Further, it is possible to yield a toner image according to the toner developing method which utilizes the tackiness of the un-exposed portion, as described, for example, in U.S. Pat. Nos. 3,060,024 and 3,649,268.

The relief image obtainable by the present process for forming photo-polymerized image exhibits strong adhesiveness to a metal or the like and high resist strength and due to these properties provide such press plate as excellent in the fastness to printing.

Further, the above relief image exhibits good fastness against the etching liquid used for the preparation of letterpress, name plate, printed circuit board and thus brings about no damage on the resist portion.

The present invention will be illustrated by the following Examples:

EXAMPLE 1

1.0 g Of polyvinyl butyral (Eslec BLS, manufactured by Sekisui Kagaku Company), 0.6 g of ethyleneglycol dimethacrylate, 6 mg of p-methoxyphenol, 0.2 g of tribromomethylphenylsulfone, 0.3 g of N-vinylcarbazole, 20 mg of 4-(p-dimethylaminostyryl)quinoline and 20 ml of acetone were mixed and dissolved under a red safety lamp, coated on a polyethylene terephthalate film having 180$\mu$ of thickness with a coating stick and then dried at 90° C. for 8 minutes. The thickness of the light-sensitive layer after being dried was 5$\mu$.

Then, polyethylene cover film having 30$\mu$ of thickness was laminated under pressure on the light-sensitive surface at 100° C. The light-sensitive layer thus treated was subjected to exposure with 2 KW high pressure mercury lamp (7.5 mW/cm, 365 nm) through a transparent positive original for 6 seconds, and then the original was removed. Thereafter, the whole surface of the light-sensitive layer was subjected to further exposure with a 250 W IR-lamp covered with a yellow filter (sharp cut 520 nm) from the distance of 10 cm for 10 seconds. A slight violet image was obtained.

Then the polyethylene cover film was removed and paper was attached under pressure at 100° C. for 3 seconds. On stripping off said paper from the light-sensitive sheet, only the adhered portion of the un-exposed part was transferred on the paper. On this portion was placed toner and the excess toner was eliminated to give a positive toner image on the portion.

EXAMPLE 2

5.0 g Of polystyrene (Styron 666, manufactured by Asahikasei Company), 1.0 g of pyrimidyl-2-tribromomethylsulfone, 50 mg of 2,4,6-triphenyl pyrylium perchlorate, 2.0 g of pentaerythritol triacrylate, 20 mg of p-methoxyphenol, 50 mg of 4-(p-dimethylaminostyryl)quinoline, 50 mg of Michler's hydrol, 50 mg of tris(p-dimethylaminophenyl)methane and 0.1 g of 2,6-di-tert.butylphenol were dissolved in 50 ml of methyl ethyl ketone to give a light-sensitive liquid. This light-sensitive liquid was coated on an aluminum plate for use in lithographic press which has been treated with a silicate by means of a rotary coating machine and then dried. Subsequently, polyethylene terephthalate cover film having the thickness of B 25μ was laminated on the surface under pressure at 120° C. After irradiation of argon ion laser beam having 0.5 W of output and 4880 Å or wavelength which is focused to about 100μ diameter with a lens at the velocity of 5 m/sec. under movement, the whole surface was subjected to exposure with a 250 W IR-lamp covered by a red filter (sharp cut 580 nm) from the distance of 10 cm for 15 seconds.

On stripping off said cover film at 80° C., the purple colored portion hardened by the photo-polymerization was retained on the aluminum plate and the un-hardened portion was stripped off together with the cover film. By the printing using an offset printing machine where the press plate thus prepared was applied, a number of sheet of printed material showing good image were obtained.

EXAMPLE 3

5.0 g of N-ethyl-N-phenylaminoethylmethacrylatemethacrylic acid copolymer (composition ratio being 50:50 and molecular weight being about 250,000), 1.0 g of α,α,α-tribromoacetophenone, 50 mg of Michler's ketone, 100 mg of leuco-xanthene, 50 mg of ferrocene and 0.1 g of 2,6-di-tert.butyl cresol, ethyl cellulose were dissolved in 100 ml of dioxane to give a light-sensitive liquid. The solution was then coated on a zinc place for use in printing the surface of which has been rubbed, by means of a rotary coating machine and dried to give a PS plate.

The PS plate thus prepared was subjected to exposure through a negative image by means of an expanding projector having as the light source a 500 W tungsten lamp and thereafter the whole surface was further subjected to exposure with a 250 W IR-lamp covered with a yellow filter (sharp cut 520 nm) to form a pale cyan color image.

After the development with 2% aqueous sodium hydroxide solution, burning treatment was carried out. By the etching of the material thus treated, using Dow etching machine, there was obtained a good printing plate for use in the letterpress printing.

EXAMPLE 4

10.0 g Of polymethyl methacrylate (Acrypet MD, manufactured by Mitsubishi Rayon Company), 2.0 g of carbon tetrabromide, 3.0 g of glycerol triacrylate, 30 mg of hydroquinone and 0.1 g of leuco-malachite green were dissolved in 100 ml of ethylene chloride and the resulting solution was coated on a silicone board by means of a spinner at the thickness of 5μ and then dried. After being subjected to exposure with an electron beam showing 20 KV of acceleration voltage, the whole surface was further subjected to exposure with an IR-lamp covered with a yellow filter, while keeping the temperature at 90° C. to form a green image.

On developing said silicone board with methyl ethyl ketone, the un-exposed portion was dissolved out and a relief having the fastness to etching was obtained on the silicone board.

EXAMPLE 5

2.0 g Of polyvinyl-4-(p-azidophenoxy)benzal, 0.4 g of pentabromoethane, 10 mg of 4-phenyl-2,6-bis(4-methoxyphenyl)pyrylium perchlorate, 20 mg of phenylmercaptotetrazole 50 mg of 2-(p-dimethylaminostyryl)-benzthiazole, 30 mg of leuco-anthracene, 60 mg of p-dimethylaminobenzaldehyde and 10 mg of 4-picoline-N-oxide were dissolved in 20 ml of trichlene to give a light-sensitive liquid. The solution was coated on a copperplate the surface of which has been rubbed, by means of a rotary coating machine and then dried. After the whole surface was subjected to exposure with a fluorescent lamp to form slight brown color, an exposure was made through a transparent original for printed circuit with an IR-lamp. Development with acetone was effected. Then, the copper plate thus treated was subjected to etching, while being immersed in 40% aqueous ferric chloride solution. After the etching, the relief image was dissolved and removed by using γ-butyrolactone to yield excellent printed circuit board.

What we claim is:

1. A process for forming a photo-polymerized image by the use of a light-sensitive layer which process comprises:

a first step of exposing the light-sensitive layer to an activating ray in the form of visible light, UV light, an electron beam or X-rays, the light-sensitive layer containing (A) an activating component in the form of a free radical generating agent or an active radiation oxidizing agent which is capable of being activated by the activating ray, (B) a light-sensitive resin selected from compounds which increase in molecular weight by being polymerized or cross-linked by means of light or compounds which vary in chemical or physical properties by being decomposed or reacted by means of light, and (C) a colorable or decolorable component selected from an arylamine, N-vinyl compounds, a leuco compound or a styryl, cyanine or merocyanine dye which is capable of being colored or decolored by the activated activating component provided that when the color of both the colored colorable component and the decolorable component absorbs an energy of a light, which light itself does not cause the polymerization of the light-sensitive resins nor activate the activating component, the energy is transferred to the light-sensitive resin for polymerization; whereby the colorable or decolorable component is either colored or decolored; and a second step of exposing the light-sensitive layer, resulting from the first step, to the light imagewise when the exposure in the first step is uniform, and uniformly when the exposure in the first step is imagewise, so that the light-sensitive resin is polymerized by the energy from the decolorable component or the colored colorable component to form the photo-polymerized image.

2. A process according to claim 1 wherein the light-sensitive resin is capable of being polymerized by the activating ray.

3. A process according to claim 1 wherein the colorable or decolorable component is colored by the activated activating agent when the exposure of the first step is uniform.

4. A process according to claim 1 wherein the activating ray is a UV or visible light having a wavelength within a range of 340–500 nm, as electron beam or X-ray, and the light in the second step has a wavelength within a range of 500–800 nm.

5. A process according to claim 1 wherein the colorable or decolorable component is colored by the activated activating component.

6. A process according to claim 1 wherein the colorable or decolorable component is leuco crystal violet, leuco-malachite green, N-vinyl carbazole, Michler's hydrol, 4-(p-dimethylaminostyryl)quinoline, a xanthene dye or a fluoran dye.

7. A process according to claim 1 wherein the light-sensitive resin is an addition polymerizable unsaturated compound, an α,β-unsaturated ketone compound, an azido compound or a diazo compound.

8. A process according to claim 7 wherein the light-sensitive resin is an ethylenically unsaturated compound.

9. A process according to claim 1 wherein the free radical generating agent is an organic halogen compound.

10. A process according to claim 9 wherein the organic halogen compound is represented by general formula I

wherein $R_0$ represents a aryl, aralkyl, alkyl, alkenyl, bezoyl or aroyl group, a heterocyclic compound residue, hydrogen, halogen, or $R_0'—SO_2—$ or $R_0'—SO—$ (where $R_0'$ represents an aryl or alkyl group or a heterocyclic compound residue; and $X_1$, $X_2$ and $X_3$ each represent hydrogen or halogen with the proviso that $X_1$, $X_2$ and $X_3$ cannot be hydrogen simultaneously.

11. A process according to claim 10 wherein the organic halogen compound is carbon tetrabromide, iodoform, α,α,α-tribromoacetophene or tribromomethylphenylsulfone.

* * * * *